United States Patent [19]
Paszkiet et al.

[11] Patent Number: 5,962,151
[45] Date of Patent: Oct. 5, 1999

[54] METHOD FOR CONTROLLING SOLDERABILITY OF A CONDUCTOR AND CONDUCTOR FORMED THEREBY

[75] Inventors: Christine Ann Paszkiet, Kokomo; Carl William Berlin, West Lafayette; Stephanie Yolanda Oden, Marion, all of Ind.

[73] Assignee: Delco Electronics Corp., Kokomo, Ind.

[21] Appl. No.: 08/985,436

[22] Filed: Dec. 5, 1997

[51] Int. Cl.$^6$ ............................... B32B 3/10; B23K 31/02
[52] U.S. Cl. .................... 428/601; 428/632; 428/614; 228/254; 228/180.22
[58] Field of Search ...................... 428/614, 601, 428/632, 633, 621, 670, 673; 228/254, 180.22

[56] References Cited

U.S. PATENT DOCUMENTS

| | | |
|---|---|---|
| 4,081,901 | 4/1978 | Miller . |
| 5,162,257 | 11/1992 | Yung . |
| 5,480,835 | 1/1996 | Carney et al. . |
| 5,494,856 | 2/1996 | Beaumont et al. . |
| 5,620,131 | 4/1997 | Kane et al. . |
| 5,738,269 | 4/1998 | Masterton . |
| 5,818,697 | 10/1998 | Armezzanie et al. . |

*Primary Examiner*—John J. Zimmerman
*Assistant Examiner*—Jason Savage
*Attorney, Agent, or Firm*—Jimmy L. Funke

[57] ABSTRACT

A conductor (112), a method for forming the conductor (112), and a method for attaching a discrete circuit device, such as a bond pad, chip capacitor, chip resistor, etc., to the conductor (112) with solder connections (16). Solder connections (16) formed by the method are characterized as being accurately located on the conductor (112) and having a shape and location that achieves an adequate and uniform stand-off height for the device, and improves thermal cycle fatigue life. Such benefits are achieved by forming a nonsolderable layer (114) on a substrate (10), and then forming a solderable conductor (112) on the substrate (10) such that a first portion of the conductor (112) overlies the nonsolderable layer (114) and a second portion of the conductor (112) does not overlie the nonsolderable layer (114). In so doing, the first and second portions of the conductor (114) define a boundary therebetween beyond which solder deposited on the second portion of the conductor (112) is inhibited from flowing onto the first portion of the conductor (112).

20 Claims, 1 Drawing Sheet

METHOD FOR CONTROLLING SOLDERABILITY OF A CONDUCTOR AND CONDUCTOR FORMED THEREBY

FIELD OF THE INVENTION

The present invention generally relates to electrical conductors of the type formed on circuit boards. More particularly, this invention relates to a method for controlling the solderability of a conductor so as to favorably control the shape and height of a solder connection that bonds a surface-mount (SM) circuit device to the conductor.

BACKGROUND OF THE INVENTION

Flip chips, ball grid arrays (BGAs), wire bond pads, chip resistors and chip capacitors are examples of surface-mount devices, i.e., discrete circuit devices mounted to the surface of a circuit board, such as a printed circuit board (PCB), ceramic substrate, printed wiring board (PWB), flexible circuit, or a silicon substrate. These devices rely on solder connections to both secure the chip to a circuit board and electrically interconnect the device to conductors formed on the circuit board. The size of a flip chip is generally on the order of a few millimeters per side, while bond pads, chip capacitors and resistors are typically smaller. As a result, the conductors required for surface-mount devices are narrow, e.g., line widths of about 0.5 millimeter or less, and typically spaced apart about 0.5 millimeter or less.

Because of the small size of the solder connections, soldering a surface-mount device to its conductor pattern requires a significant degree of precision. Reflow solder techniques are widely employed for this purpose, and typically entail precisely depositing a controlled quantity of solder using methods such as printing and electrodeposition. For smaller surface-mount devices, such as chip resistors and capacitors, the chip is soldered to its conductors by registering terminals formed on the chip with solder deposited on the conductors, and then reheating, or reflowing, the solder so as to form a "solder column" that metallurgically adheres and electrically interconnects the chip to the conductors, yielding what will be referred to herein as a solder connection. Mounting of flip chips and BGAs differ in that the solder is typically deposited on bond pads on the chip. Thereafter, the chip is heated above the liquidus temperature of the solder to yield "solder bumps." After cooling to solidify the solder bumps, the chip is soldered to the conductor pattern by registering the solder bumps with their respective conductors and then reflowing the solder, again forming solder connections.

Placement of the chip and reflow of the solder must be precisely controlled not only to coincide with the spacing of the terminals and the size of the conductors, but also to control the orientation of smaller surface-mount devices and the height of flip chip solder connections after soldering. As is well known in the art, smaller chips are prone to twisting and tilting during reflow as a result of the device floating on the surface of the molten solder, while controlling the height of flip chip solder connections after reflow is often necessary to prevent the surface tension of the molten solder bumps from drawing the flip chip excessively close to the substrate during the reflow operation. Sufficient spacing between a flip chip and its substrate, which may be termed the "stand-off height," is desirable for enabling stress relief during thermal cycles, allowing penetration of cleaning solutions for removing undesirable processing residues, and enabling the penetration of mechanical bonding and encapsulation materials between the chip and its substrate.

The position and height of a solder column of a discrete component are generally controlled by limiting the surface area over which the printed solder is allowed to reflow. As illustrated in FIG. 1, which shows a conductor 12 in longitudinal cross-section, the latter approach typically involves the use of solder stops 14, which can be formed by a solder mask or printed dielectric. The solder stops 14 are shown as extending widthwise across the surface 18 of the conductor 12, which has been printed or otherwise formed on a circuit substrate 10. A printed pad of solder 16 is shown as being adhered to the surface 18 of the conductor 12, as would be the case after solder has been printed and reflow soldered to the conductor 12. As is apparent from FIG. 1, the solder stops 14 delineate a rectangular-shaped area on the surface 18 of the conductor 12 over which the solder is able to flow during reflow. By properly locating the solder stops 14 on the conductor 12, the degree to which the molten solder can spread during reflow is controlled, which in turn determines the height of the solder connection and therefore the stand-off height of the component relative to the substrate 10.

Because the solder 16 is registered and soldered directly to the conductor 12, the conductor 12 must be formed of a solderable material, which as used herein means that a tin, lead or indium-based alloy is able to adhere to the conductor 12 through the formation of a metallurgical bond. In contrast, the solder stops 14 are intentionally formed of a nonsolderable material, meaning that a tin, lead or indium-based solder will not adhere to the material for failure to form a metallurgical bond. Upon reflow, the rectangular-shaped reflow area formed by the solder stops 14 on the conductor 12 yields a solder connection having a columnar shape between the component (not shown) and the conductor 12.

While solder stops are widely used in the art, trends in the industry have complicated the ability for solder stops to yield solder connections that exhibit adequate reliability for small discrete components such as wire bond pads, chip capacitors and chip resistors. Particularly, the trend is toward the use of low-melting, high-tin (e.g., 60Sn-40Pb) solder that is relatively brittle. Thermal cycle reliability problems can occur when a brittle solder solidifies against a solder stop used to contain the solder during reflow. Fatigue fracturing during thermal cycling tends to occur at the junction between the conductor, solder and solder stop.

Accordingly, it would be desirable if an improved method were available for controlling the region of a conductor over which solder can flow during reflow soldering of a device to the conductor, so as to achieve proper placement of the device while promoting the reliability and durability of the solder connection that mechanically secures the device to the conductor.

SUMMARY OF THE INVENTION

It is an object of this invention to provide a method for controlling the region of a conductor over which solder will flow and subsequently bond.

It is another object of this invention that such a method produces conductors that promote the reliability and durability of solder connections that secure a surface-mount circuit device, such as wire bond pads, chip capacitors, chip resistors, flip chips and BGAS, to the conductors.

It is yet another object of this invention that such conductors are formed of a solderable conductive material in which nonsolderable regions are formed.

The present invention provides a conductor, a method for forming the conductor, and a method for attaching a surface-mount circuit device, such as chip capacitors, chip resistors and bond pads, to the conductor with solder connections. Solder connections formed by the method are characterized as being accurately located on the conductor and having a shape that achieves an adequate stand-off height for the device, promotes stress relief during thermal cycling, and reduces the likelihood that the device will twist and tilt during reflow.

According to this invention, the above benefits are achieved by forming a conductor on a substrate to include a nonsolderable layer on the substrate, and then forming a solderable electrically-conductive layer on the substrate such that a first portion of the conductive layer overlies the nonsolderable layer and a second portion of the conductive layer does not overlie the nonsolderable layer. In so doing, the first and second portions of the conductive layer define a boundary therebetween beyond which solder deposited on the second portion of the conductive layer is inhibited from flowing onto the first portion of the conductive layer. In accordance with the present invention, it has been surprisingly determined that the presence of the nonsolderable layer beneath the conductive layer renders the surface of the conductive layer unsolderable, thereby inhibiting reflow of solder on, and subsequently preventing metallurgical bonding of, the solder to that surface portion of the conductive layer over the nonsolderable layer. This aspect of the invention is particularly surprising since the physical integrity of the conductor is maintained across a region that has been rendered locally unsolderable.

The invention is particularly applicable to thick-film conductors, to which the solder of a surface-mount device is registered and reflowed to form solder connections that bond the device to the conductors. In accordance with this invention, the solder portions of the device (e.g., terminals and bond surfaces) are registered and reflowed to the portion of the conductive layer that does not overlie the nonsolderable layer. During reflow, the presence of the nonsolderable layer beneath the conductive layer inhibits the molten solder from flowing onto and metallurgically bonding to those regions of the conductive layer that overlie the nonsolderable layer.

In view of the above, it can be seen that this invention provides a method for forming a conductor having a defined solderable region over which a molten solder will flow, such that the size and shape of the solderable region determine the shape, height and distribution of the resulting solder connection on the conductor following reflow. The invention achieves this object without the use of conventional solder stops that overlie the conductor. Accordingly, conductors and solder connections of this invention are not susceptible to the same mechanics and stresses that can reduce the reliability and durability of prior art conductors using such solder stops. Notably, conductors formed in accordance with this invention have been determined to exhibit improved reliability and durability over prior art conductors using solder stops formed of conventional solder stop materials.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 2:
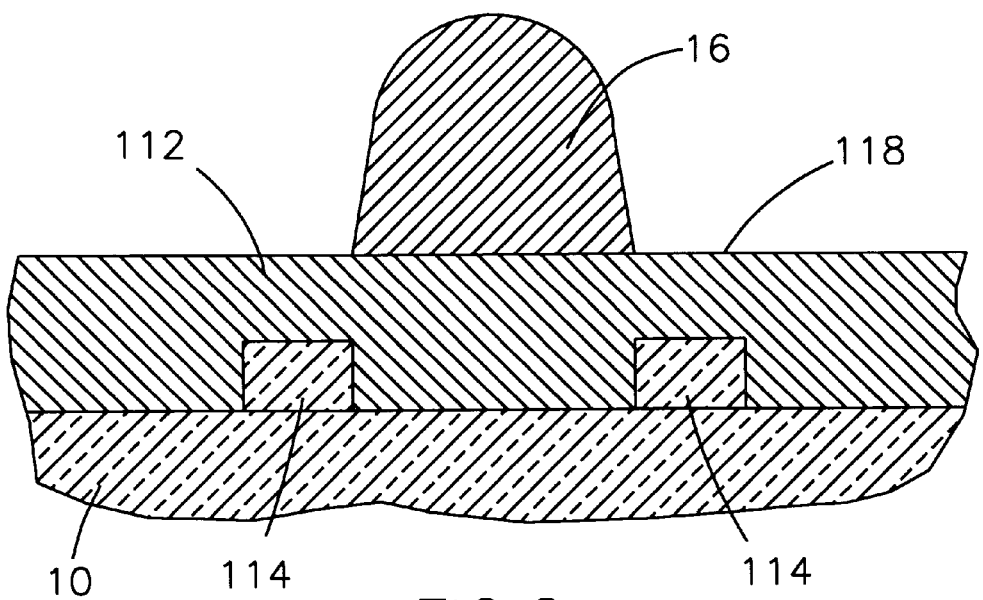
FIG. 2 is a cross-sectional view of a solder connection of a surface-mount device registered with a solderable region of a conductor formed in accordance with the present invention.

With reference to FIG. 2, there is shown a solder connection 16 for a surface-mount device (not shown) in accordance with this invention. As shown, the solder connection is as it generally appears following deposition of solder on a conductor 112 and following a solder reflow operation that metallurgically bonds the solder to the conductor 112, producing the solder connection 16 with a columnar shape (in the absence of the device, the top of the solder connection 16 is depicted as having a semispherical shape). This invention is applicable to essentially any surface-mount component, including wire bond pads, chip capacitors, chip resistors, flip chips and BGAS. Accordingly, benefits arising from this invention can be realized for essentially any application in which solder must be reflowed on a conductor.

The conductor 112 shown in FIG. 2 has been printed or otherwise formed on a substrate 10, which may be a ceramic substrate, printed wiring board, flexible circuit or silicon substrate, as is known in the art. As shown, the conductor 112 overlies a pair of nonsolderable films 114 which, according to this invention, serve as sub-conductor solder stops that reduce the solderability of the conductor 112 in a region of its surface 118 directly above the nonsolderable films 114. Also according to this invention, the solder is printed on and reflow soldered to a region of the conductor surface 118 between the nonsolderable films 114, but is inhibited from flowing onto the conductor surface 118 that overlies the nonsolderable films 114, as portrayed in FIG. 2.

As is conventional for electronic applications, the solder composition that forms the solder connection 16 may be a tin or lead-base solder alloy that can be reflowed at sufficiently low temperatures to avoid thermal damage to the circuitry. As is also conventional, the conductor 112 can be formed of known solderable metallic compositions. As used herein, the term "nonsolderable" used in reference to the films 114 denotes a material to which solder will not metallurgically bond and reliably adhere for purposes of making an electrical interconnection, while "solderable" used in reference to the conductor 112 denotes a material to which such solder will metallurgically bond and reliably adhere, as determined in the art using known test methods. Conductor compositions deemed solderable according to this definition include those formed from various thick-film pastes or inks, notable examples of which include QS179 and 7484, produced and commercially available from E. I. DuPont de Nemours and Company, Inc., of Wilmington, Del. The QS179 composition is based on silver-platinum alloys, while the 7484 composition is based on silver-palladium alloys.

The above definition for "nonsolderable" applies to various dielectric and resistive materials known to those skilled in the art. Compositions deemed nonsolderable according to this definition generally contain sufficient amounts of oxides and/or glass materials that prevent a solder from metallurgically bonding to the films 114. Alternatively, other nonsolderable materials such as polymers could be used to form the films 114 of this invention. A suitable thick-film nonsolderable film 114 can be formed from dielectric ink compositions containing glass frit materials combined with a screening agent. Two suitable dielectric ink compositions used during the course of investigating this invention contained one of two glass frit compositions described below in weight percents.

| Constituent | Frit "A" | Frit "B" |
|---|---|---|
| $Al_2O_3$ | 10.3 | 10.3 |
| $B_2O_3$ | 10.0 | 10.0 |
| CaO | 8.5 | 8.5 |
| $SiO_2$ | 35.8 | 35.8 |
| $TiO_2$ | 9.8 | 9.8 |
| $SrO_2$ | 26.5 | — |
| BaO | — | 26.5 |

It is foreseeable that inks containing different percentages of the oxides noted above and/or with combinations of $SrO_2$ and BaO could be used to form suitable nonsolderable films 114.

According to the invention, the nonsolderable characteristic of the films 114 affects the solderability of the surface regions of the conductor 112 directly overlying the films 114. As shown in FIG. 2, the reduced solderability of these regions of the conductor 112 inhibits a volume of solder placed on the conductor 112 from flowing onto these regions when the solder is melted, as during a reflow operation. Accordingly, a region of printed solder registered with the conductor 112 and then reflowed forms a solder connection 16 exclusively on the surface 118 of the conductor 112 between the nonsolderable films 114. As a result, the locations of the films 114 beneath the conductor 112 dictate the location and influence the shape and size of the solder connection 16 on the conductor 112.

Figure 1:
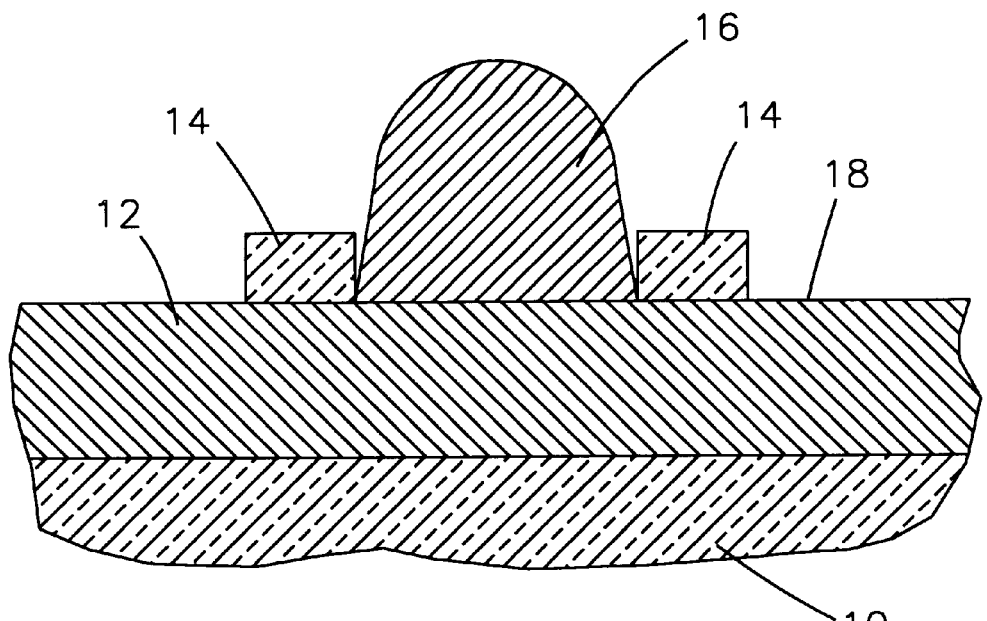
FIG. 1 is a cross-sectional view of a solder connection of a surface-mount device registered with a conductor employing solder stops in accordance with the prior art.

The accuracy with which the placement of the films 114 can be tailored by printing techniques enables the forming of solder connections whose size, shape and height can be precisely and readily determined. Importantly, this capability is achieved without resorting to conventional solder stops placed at the surface of the conductor 112, as done with prior art conductors 12 of the type illustrated in FIG. 1. According to this invention, the use of the sub-conductor nonsolderable films 114 improves the durability and reliability of solder connections 16 on the conductor 112, as evidenced by improved thermal cycle fatigue resistance of the solder connection 16 with the conductor 112.

The present invention generally makes use of known processing techniques. According to known thick-film processes, the nonsolderable films 114 used to form the sub-conductor solder stops of this invention can be deposited onto a suitable substrate by printing, after which the substrate is fired at a temperature sufficient to volatilize or burn off the screening agent and fuse the remaining constituents of the ink composition to form the films 114. The conductive ink composition for the conductor 112 is then printed using a similar technique, and then fired. While not wishing to be held to any theory, it is believed that during firing of the conductor, diffusion of certain constituents of the nonsolderable films 114 occurs, causing the regions of the conductor above the films 114 to be significantly less solderable.

Solder paste for attachment of a surface-mount device to the conductors 112 is generally printed directly on the conductor 112 prior to registration of the device with the conductor 112. Suitable solder alloys include, but are not limited to, tin-based, lead-based and indium-based alloys, with a notable example being tin-lead alloys containing about 10 to about 60 percent tin, with possible alloying additions of antimony, silver, etc. The areas of printed solder are reflowed by heating, such that the solder wets and adheres to the surface region of the conductor 112 between the nonsolderable films 114, thereby attaching the device to the conductor and the underlying substrate 10. Reflow can be achieved by any of a number of techniques well known in the art, and therefore will not be discussed in detail here.

During the evaluation of this invention, nonsolderable films 114 containing the above-noted glass frits were successfully printed and fired on an alumina substrate, over which solderable conductors of 7484 ink were printed and fired to form a conductor pattern on the substrate. The substrate was then immersed in molten 60Sn-40Pb solder, such that the solder was applied to all surfaces of the substrate. After cooling, the solder did not cover or adhere to very obvious and well-defined areas on those surface regions of the conductors directly over the nonsolderable films. Accordingly, the sub-conductor nonsolderable films 114 of this invention were shown to reduce the solderability of a conductor overlying the films 114.

Tests were then performed to evaluate the thermal cycle reliability of solder connections formed with conductors of this invention. Test patterns were constructed with alumina substrates by forming placement pads on the substrates in adjacent spaced-apart pairs, with each pair having conductors running in opposite directions from the pads. The pads and conductors were formed together by conventional thick-film processing from the 7484 conductor ink noted above. Each adjacent pair of placement pads was spaced sufficiently close to allow a copper pad, about 0.080×0.080 inch (about 2×2 mm) and having a thickness of about 0.030 inch (about 0.75 mm), to be attached with 60Sn-40Pb solder to the pair and bridge the gap therebetween for the purpose of simulating a surface-mount device. By bridging the gap between an adjacent pair of placement pads with a copper pad, any crack in or between the solder and placement pads could be easily and nondestructively detected by electrical probing.

A solder stop was formed on each of the conductors to be about ten, fifteen, twenty or twenty-five mils (about 250, 375, 500 or 625 micrometers) from the corresponding placement pad. One set of test patterns was provided with solder stops formed of a dielectric thick-film available under the name 5707 from DuPont. This material was used to form solder stops that extend transversely across a conductor in a manner similar to that shown in FIG. 1. A second set of test patterns was formed with nonsolderable films 114 in accordance with this invention (also referred to as "sub-conductor solder stops" below), in a manner similar to that shown in FIG. 2. The films 114 were formed from a dielectric ink formed by combining Frit "A" with a screening agent.

Each of the test patterns underwent thermal cycling between −50° C. and 150° C., with the electrical resistance across each pair of placement pads (referred to as a "test pair" below) being checked initially and after 29, 54 and 135 thermal cycles. The resistance data from the test after 29 cycles was used as a baseline reference, as resistances at this stage were lower than initial measurements, believed due to the growth of an intermetallic layer between the solder and conductor during the initial thermal exposure. Changes in resistance were then calculated as the measured resistance across a test pair minus the resistance after 29 cycles, the difference divided by the resistance after 29 cycles.

Changes in resistance for test pairs of all test patterns were minimal for those specimens whose solder stops were placed twenty or twenty-five mils from the placement pads. This is believed attributable to the lower stresses that are induced at the solder-conductor junction as a result of the solder connections being lower and more spread out along the conductor. However, changes in resistance were significant and strongly dependent on solder stop type for test pairs whose stops were spaced ten and fifteen mils from the placement pad. Fractional increases in the resistances of the test pairs are summarized below in Tables I and II for stops spaced fifteen and ten mils, respectively.

TABLE I

| SOLDER STOP | AVERAGE FRACTIONAL INCREASE IN RESISTANCE AFTER: | |
| --- | --- | --- |
| TYPE | 54 CYCLES | 135 CYCLES |
| DIELECTRIC | 0.453 | 16.8* |
| SUB-CONDUCTOR | 0.496 | 0.444 |

TABLE II

| SOLDER STOP | AVERAGE FRACTIONAL INCREASE IN RESISTANCE AFTER: | |
| --- | --- | --- |
| TYPE | 54 CYCLES | 135 CYCLES |
| DIELECTRIC | 0.783 | 1080 |
| SUB-CONDUCTOR | 0.502 | 7.98 |

"DIELECTRIC": Prior art thick-film solder stops.
"SUB-CONDUCTOR": Nonsolderable films of this invention.
*One reading was infinity; Data is from remaining readings.

As indicated by the above data, percent change in resistance was rather low for both types of solder stops after 54 cycles, though for solder stops spaced ten mils from their placement pads, the maximum measured increase in resistance for the prior art "dielectric" solder stops was about three times higher than the maximum increase for test pairs formed with the "sub-conductor" solder stops of this invention. After 135 cycles, a greater difference in percent change in resistance can be seen between the prior art solder stops and the sub-conductor solder stops of this invention. For the test pairs whose solder stops were spaced fifteen mils from the placement pads, a measurement from one of the test pairs with prior art solder stops was infinity, indicating that a crack extended completely through the conductive path between the conductors of the test pair. The crack was visible at the solder-conductor-solder stop interface on this test pair.

From the above, it can be seen that the present invention provides a conductor that exhibits enhanced reliability and durability as compared to conductors equipped with prior art dielectric solder stops. In contrast to prior art solder stops that are applied after a conductor has been printed and fired, the nonsolderable films of the invention are printed before the conductor is formed. The resulting "sub-conductor solder stop" renders unsolderable a region of a fired conductor overlying the stop, thereby inhibiting the flow of solder onto that region of the conductor and further preventing the solder from metallurgically bonding to that region of the conductor.

While the invention has been described in terms of a preferred embodiment, it is apparent that other forms could be adopted by one skilled in the art. For example, various materials could be foreseeably used to form the substrate 10, conductor 112 and nonsolderable films 114, and conductors within the scope of this invention could be employed in applications other than those noted. Accordingly, the scope of the invention is to be limited only by the following claims.

What is claimed is:

1. A method for controlling solderability of an electrical conductor, the method comprising the steps of:

printing and firing a nonsolderable layer on a substrate; and printing and firing a solderable electrically-conductive layer on the substrate such that a first portion of the electrically-conductive layer overlies the nonsolderable layer and a second portion of the electrically-conductive layer does not overlie the nonsolderable layer, the first and second portions of the electrically-conductive layer defining a boundary therebetween beyond which solder deposited on the second portion of the electrically-conductive layer is inhibited from flowing onto the first portion of the electrically-conductive layer during reflow of the solder.

2. A method as recited in claim 1, wherein the nonsolderable layer contains at least one oxide selected from the group consisting of $Al_2O_3$, $B_2O_3$, CaO, $SiO_2$, $TiO_2$, $SrO_2$ and BaO.

3. A method as recited in claim 1, wherein the electrically-conductive layer contains a metallic composition chosen from the group consisting of silver-palladium and silver-platinum alloys.

4. A method as recited in claim 1, wherein the step of forming the nonsolderable layer entails a thick-film printing operation.

5. A method as recited in claim 1, wherein the step of forming the electrically-conductive layer entails a thick-film printing operation.

6. A method as recited in claim 1, further comprising the steps of placing a solder on the electrically-conductive layer and then heating the solder such that the solder flows on the electrically-conductive layer, wherein the solder is inhibited from flowing onto the first portion of the electrically-conductive layer due to the presence of the nonsolderable layer below the first portion of the electrically-conductive layer.

7. A method as recited in claim 1, further comprising the steps of:

placing a solder on the electrically-conductive layer;

registering a surface-mount device with the electrically-conductive layer such that a solder termination on the surface-mount device contacts the solder on the electrically-conductive layer; and heating the solder so as to flow the solder and form a solder connection that bonds to the second portion of the electrically-conductive layer but does not bond to the first portion of the electrically-conductive layer.

8. A method as recited in claim 1, wherein the step of forming the nonsolderable layer entails forming a pair of nonsolderable layers spaced apart on the substrate, and wherein the first portion of the electrically-conductive layer overlies a first of the nonsolderable layers and a third portion of the electrically-conductive layer overlies a second of the nonsolderable layers.

9. A method as recited in claim 8, further comprising the steps of placing a solder on the electrically-conductive layer and then heating the solder such that the solder flows on the electrically-conductive layer, wherein the solder is inhibited from flowing onto the first and third portions of the electrically-conductive layer due to the presence of the first and second nonsolderable layers below the first and third portions of the electrically-conductive layer.

10. A method as recited in claim 8, further comprising the steps of:

registering a surface-mount device with the electrically-conductive layer such that a solder termination on the surface-mount device contacts the second portion of the electrically-conductive layer; and heating the solder so as to flow the solder and form a solder connection that bonds to the second portion of the electrically-conductive layer but does not bond to the first and third portions of the electrically-conductive layer.

11. A electrical conductor having controlled solderability, the electrical conductor comprising:

a fired nonsolderable layer on a substrate; and a fired solderable electrically-conductive layer on the substrate such that a first portion of the electrically-conductive layer overlies the nonsolderable layer and a second portion of the electrically-conductive layer does not overlie the nonsolderable layer, the first and second portions of the electrically-conductive layer defining a boundary therebetween beyond which solder deposited on the second portion of the electrically-conductive layer is inhibited from flowing onto the first portion of the electrically-conductive layer during reflow of the solder.

12. An electrical conductor as recited in claim 11, wherein the nonsolderable layer contains a glass frit.

13. An electrical conductor as recited in claim 11, wherein the electrically-conductive layer contains a metallic composition chosen from the group consisting of silver-palladium and silver-platinum alloys.

14. An electrical conductor as recited in claim 11, wherein the nonsolderable layer is a thick-film dielectric.

15. An electrical conductor as recited in claim 11, wherein the electrically-conductive layer is a thick-film conductor.

16. An electrical conductor as recited in claim 11, further comprising a solder on the electrically-conductive layer bonded to the second portion of the electrically-conductive layer and not bonded to the first portion of the electrically-conductive layer due to the presence of the nonsolderable layer below the first portion of the electrically-conductive layer, the nonsolderable layer rendering unsolderable the first portion of the electrically-conductive layer.

17. An electrical conductor as recited in claim 11, further comprising a surface-mount device registered with the electrically-conductive layer such that a solder connection bonds the surface-mount device to the electrically-conductive layer but does not bond to the first portion of the electrically-conductive layer.

18. An electrical conductor as recited in claim 11, wherein a pair of nonsolderable layers is spaced apart on the substrate, the first portion of the electrically-conductive layer overlying a first of the nonsolderable layers and a third portion of the electrically-conductive layer overlying a second of the nonsolderable layers.

19. An electrical conductor as recited in claim 18, further comprising a solder bonded to the second portion of the electrically-conductive layer but not bonded to the first and third portions of the electrically-conductive layer due to the presence of the first and second nonsolderable layers below the first and third portions of the electrically-conductive layer, the first and second nonsolderable layers rendering unsolderable the first and third portions of the electrically-conductive layer.

20. An electrical conductor as recited in claim 18, further comprising a surface-mount device registered with the electrically-conductive layer such that a solder connection bonds the surface-mount device to the electrically-conductive layer but does not bond to the first and third portions of the electrically-conductive layer.

* * * * *